United States Patent
Ker et al.

(10) Patent No.: US 7,542,253 B2
(45) Date of Patent: Jun. 2, 2009

(54) SILICON CONTROLLED RECTIFIER FOR THE ELECTROSTATIC DISCHARGE PROTECTION

(75) Inventors: Ming-Dou Ker, Hsinchu (TW); Kun-Hsien Lin, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 346 days.

(21) Appl. No.: 10/857,836

(22) Filed: Jun. 2, 2004

(65) Prior Publication Data
US 2005/0270710 A1  Dec. 8, 2005

(51) Int. Cl.
*H02H 9/00* (2006.01)
(52) U.S. Cl. ........................................... 361/56
(58) Field of Classification Search ............... 361/56
See application file for complete search history.

(56) References Cited

U.S. PATENT DOCUMENTS

| | | | | |
|---|---|---|---|---|
| 4,947,227 A | * | 8/1990 | Teng | 257/374 |
| 5,702,973 A | * | 12/1997 | Mitani et al. | 438/16 |
| 5,959,820 A | | 9/1999 | Ker et al. | 361/111 |
| 6,011,681 A | * | 1/2000 | Ker et al. | 361/111 |
| 6,014,053 A | * | 1/2000 | Womack | 327/538 |
| 6,081,002 A | * | 6/2000 | Amerasekera et al. | 257/173 |
| 6,242,763 B1 | * | 6/2001 | Chen et al. | 257/107 |
| 6,410,963 B1 | | 6/2002 | Lai et al. | 257/355 |
| 6,465,283 B1 | * | 10/2002 | Chang et al. | 438/135 |
| 6,498,357 B2 | * | 12/2002 | Ker et al. | 257/173 |
| 6,521,952 B1 | * | 2/2003 | Ker et al. | 257/360 |
| 6,618,233 B1 | * | 9/2003 | Russ et al. | 361/111 |
| 2002/0089017 A1 | * | 7/2002 | Lai et al. | 257/355 |

OTHER PUBLICATIONS

Albert Z. Wang; "A New Design For Complete On-Chip ESD Protection"; Dept. of Electrical & Computer Engineering; IEEE 2000; pp. 87-90.

* cited by examiner

*Primary Examiner*—Stephen W Jackson
*Assistant Examiner*—Ann T Hoang
(74) *Attorney, Agent, or Firm*—Troxell Law Office PLLC

(57) ABSTRACT

The present invention relates to an SCR (Silicon Controlled Rectifier) for the ESD (electrostatic discharge) protection comprising two terminal electrodes of a first electrode and a second electrode, a PMOS, an NMOS and an SCR structure. By utilizing an embedded SCR, a whole-chip ESD protection circuit design can be obtained. The present invention is suitable for IC products, and for applications by IC design industries and IC foundry industries.

15 Claims, 36 Drawing Sheets

SILICON CONTROLLED RECTIFIER FOR THE ELECTROSTATIC DISCHARGE PROTECTION

FIELD OF THE INVENTION

The present invention relates to a silicon controlled rectifier (SCR) for the electrostatic discharge (ESD) protection. More particularly, the present invention relates to a device which utilizes embedded SCR as ESD protection device in order to achieve whole-chip ESD protection circuit design.

DESCRIPTION OF THE RELATED ART

With references to FIG. 34, FIG. 35(a) and FIG. 35(b) which are views showing related conventional techniques. FIG. 34 is a view showing an ESD protection design for Complementary Metal Oxide Semiconductor (CMOS) integrated circuit (IC) of a conventional art. FIG. 35(a) is a view showing an ESD protection device of a conventional art having a single guard ring structure inserted between the PMOS and NMOS of I/O buffers while FIG. 35(b) is a view showing an ESD protection device of a conventional art having double guard ring structures inserted between the PMOS and NMOS of I/O buffers.

In the above on-chip ESD protection, the ESD protection devices are formed by PMOS and NMOS devices connected to the VDD and VSS power lines, respectively. To avoid unexpected ESD damage in the internal circuits of CMOS ICs, the power-rail ESD clamp circuit was added between VDD and VSS power lines. Whole-chip ESD protection design of a CMOS IC can be achieved by the ESD protection devices at the I/O pads cooperating with the power-rail ESD clamp circuit. However, the ESD robustness of the whole chip is strongly dependent on the space between the I/O pad and power-rail ESD clamp circuit. In addition, extra layout area is needed to implement the power-rail ESD clamp circuit.

In CMOS technology, the SCR device has been commonly used for on-chip ESD protection. Comparing the SCR device to the other ESD protection devices such as diode, MOS, BJT, or field-oxide device which are used in the CMOS integrated circuit, the SCR device in the on-chip ESD protection circuit can sustain much higher ESD voltage within a smaller layout area due to the low holding voltage (~1V) of the SCR device. On the other hand, while the IC is in a normal operating condition, the SCR device is susceptible to latch-up issue because the SCR device may be accidentally triggered on by the external noise pulses due to the holding voltage of the SCR device with smaller voltage than that of the power supply. Thereby, the latch-up phenomenon often leads to IC function failure or even destruction. In order to safely apply the SCR device to the on-chip ESD protection, several methods are proposed to solve the latch-up issue.

Therefore, several articles of conventional techniques which are to solve the latch-up issue caused by applying SCR device to the on-chip ESD protection are proposed, as the followings are two examples.

In "Electrostatic discharge protection circuits with latch-up prevention function", U.S. Pat. No. 6,410,963, June, 2002, by C. S. Lai et al., an ESD protection is disclosed which comprises an SCR device comprising at least a first bipolar junction transistor and a second bipolar junction transistor; a first MOS between an interface terminal and the second bipolar junction transistor; and a second MOS between the emitter and the ground of the second bipolar junction transistor. The above device is presented for an ESD protection and the elimination of the latch-up issue.

In "Cascode LVTSCR and ESD protection circuit", U.S. Pat. No. 5,959,820, September 1999, by Ming-Dou Ker et al., an ESD protection is disclosed by using two or more SCRs, each comprising an anode, a control gate, and a cathode. By the device stated above, an efficient ESD protection and the elimination of the latch-up issue can be attained.

According to the above conventional techniques, however, with the scaled-down device dimension, the VDD supply voltage is also scaled down to meet the circuit performance requirement. The VDD supply voltage is only 1.2V with 0.13-µm CMOS technology. When the holding voltage of SCR device is higher than the VDD supply voltage, latch-up issue will not occur. Therefore, the extra design on SCR device for latch-up issue is not necessary.

Subsequently, in "A new design for complete on-chip ESD protection" by A. Z. Wang et al., on pp. 87-90 of Proc. of Custom Integrated Circuits Conf., 2000, the production process is modified by adding an $N^+$ buried layer (NBL), and a much higher trigger voltage is required to turn on the SCR device for achieving an efficient ESD protection.

In the present invention, the embedded SCR structure formed between PMOS and NMOS of I/O buffers is to serve as a power-rail ESD clamp circuit. Therefore, a whole-chip ESD protection design can be achieved by each individual I/O cell without an extra power-rail ESD clamp circuit.

The present invention is fully compatible with general CMOS process without adding extra fabrication or mask. According to the present invention, the ESD robustness of the whole chip can be efficiently improved with a much smaller layout area.

SUMMARY OF THE INVENTION

The main purpose of the invention is to provide a whole-chip ESD protection design with SCR which can be implemented on a single I/O cell in CMOS IC.

Another purpose of the present invention is to provide ESD robustness for the whole chip which is efficiently improved within a much smaller layout area.

The third purpose of the present invention is to provide an SCR for the ESD protection that can be applied to a sub 0.13-µm CMOS IC product.

For the above purposes, the present invention relates to a circuit and a method which utilizes an embedded SCR to provide a whole-chip ESD protection design. The present invention relates to an SCR for the ESD protection which is comprised of a first electrode having high-potential power supply voltage such as VDD and a second electrode having low-potential power supply voltage such as VSS; a PMOS; an NMOS; and an SCR structure. According to the present invention, a whole-chip ESD protection design can be implemented on a single I/O cell without extra power-rail ESD clamp circuit. In addition, the ESD robustness of the whole chip can be efficiently improved with a much smaller layout area. Therefore, the present invention is suitable for application for integrated circuit products.

BRIEF DESCRIPTION OF THE INVENTION

The present invention will be better understood from the following detailed description of preferred embodiments of the invention, taken in conjunction with the accompanying drawings, in which:

FIG. 35($b$) is a view showing an ESD protection device having double guard ring structures inserted between the PMOS and NMOS of I/O buffers of a conventional art.

DESCRIPTION OF THE PREFERRED EMBODIMENTS

The following descriptions of the preferred embodiments are provided to understand the features and the structures of the present invention.

Figure 1:
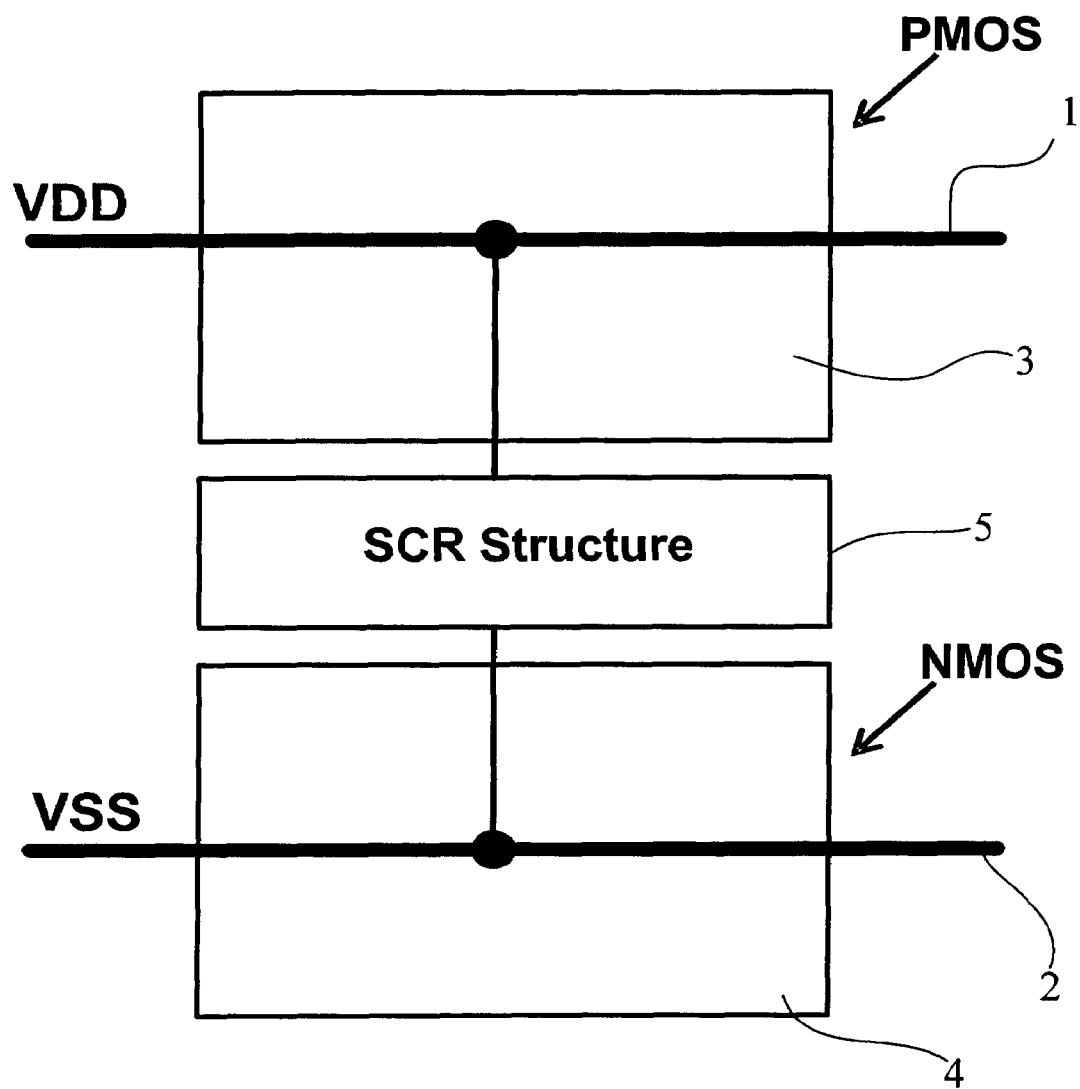
FIG. 1 is a view showing the structure according to the present invention.

Please refer to FIG. 1. FIG. 1 is a view showing the structure according to the present invention. As shown in the FIG. 1, the present invention relates to an SCR (Silicon-Controlled Rectifier) for ESD (Electrostatic Discharge) protection which comprises two terminal electrodes of a first electrode 1 having high-potential power supply voltage such as VDD and a second electrode 2 having low-potential power supply voltage such as VSS, a PMOS 3, an NMOS 4 and an SCR structure 5. Therein, the PMOS 3 is connected to the first electrode 1 and the NMOS 4 is connected the second electrode 2, while the SCR structure 5 is placed between PMOS 3 and NMOS 4 for forming an ESD protection. Concerning the structure of the SCR for the ESD protection according to the present invention, the SCR structure 5 can be changed depending on different respective embodiments of the present invention, yet the remaining structures are still depending on the structure of the present invention which is stated above.

The present invention relates to an SCR for the ESD protection. More particularly, the present invention relates to a circuit and a method which utilizes an embedded SCR in order to provide whole-chip ESD protection design for achieving the effectiveness of ESD protection circuit.

Figure 2:
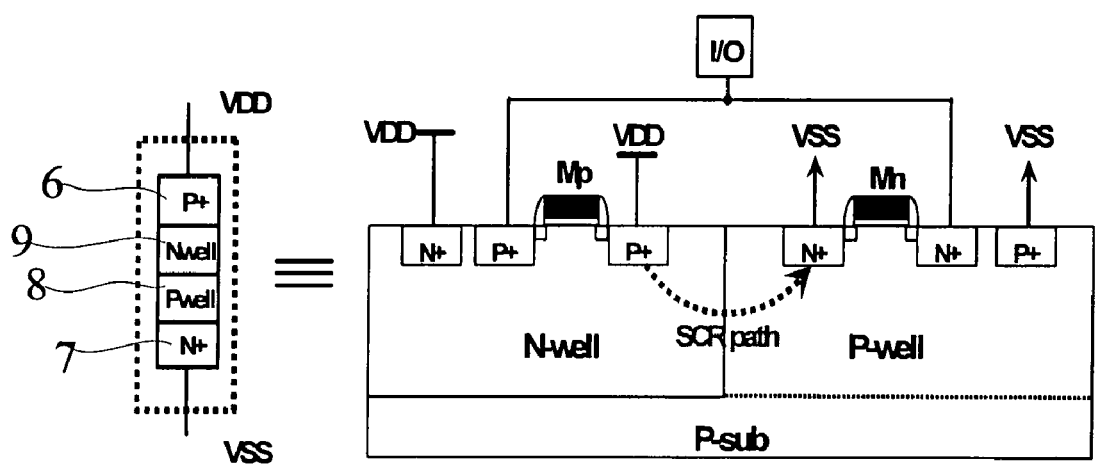
FIG. 2 is a view showing a first embodiment according to the present invention.
Figure 3:
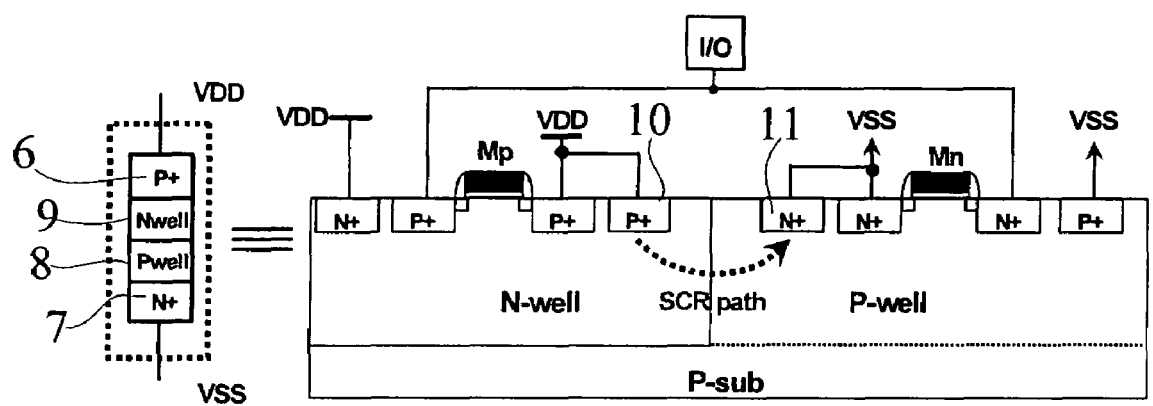
FIG. 3 is a view showing a second embodiment according to the present invention.
Figure 4:
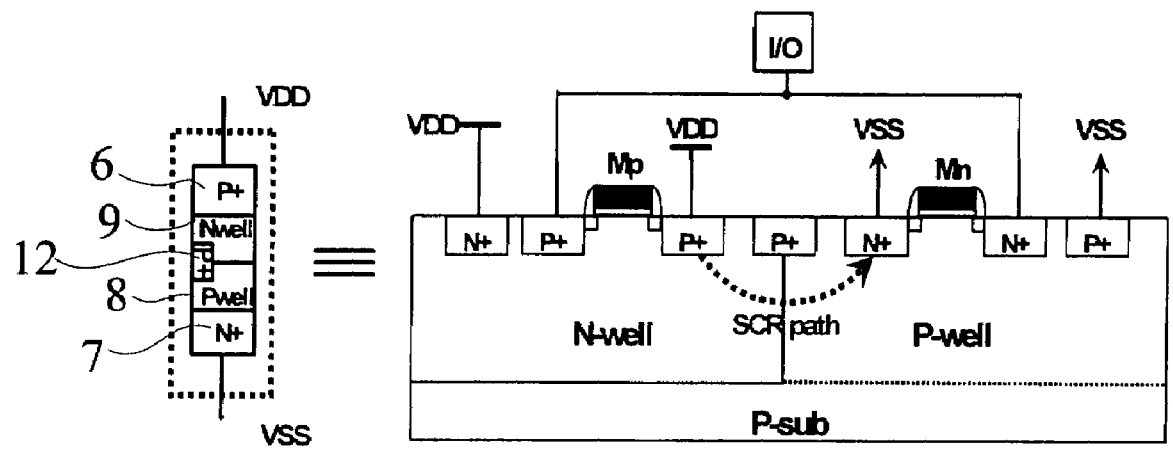
FIG. 4 is a view showing a third embodiment according to the present invention.
Figure 5:
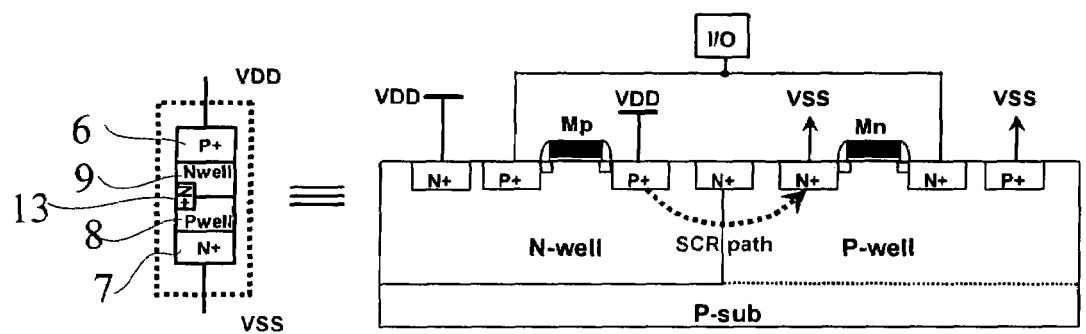
FIG. 5 is a view showing a fourth embodiment according to the present invention.
Figure 6:
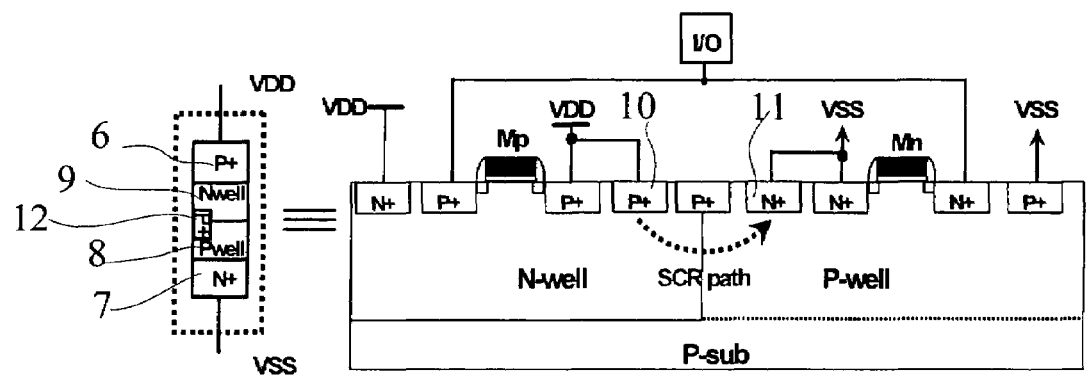
FIG. 6 is a view showing a fifth embodiment according to the present invention.
Figure 7:
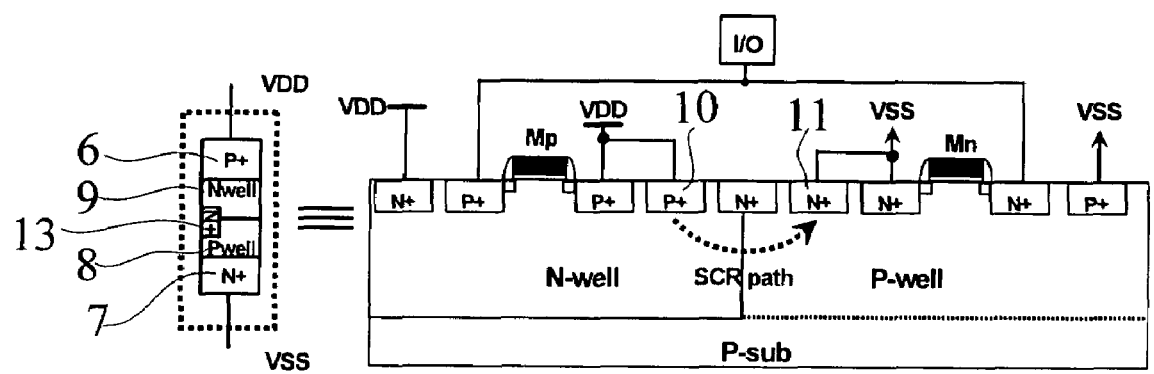
FIG. 7 is a view showing a sixth embodiment according to the present invention.
Figure 8:
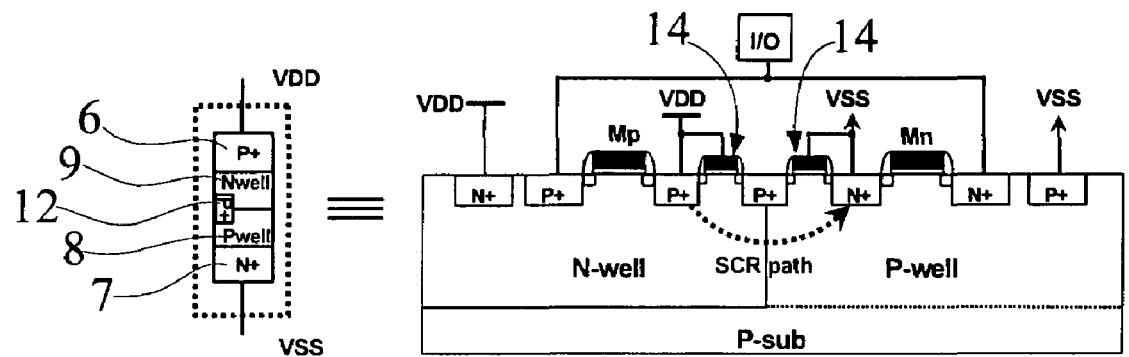
FIG. 8 is a view showing a seventh embodiment according to the present invention.
Figure 9:
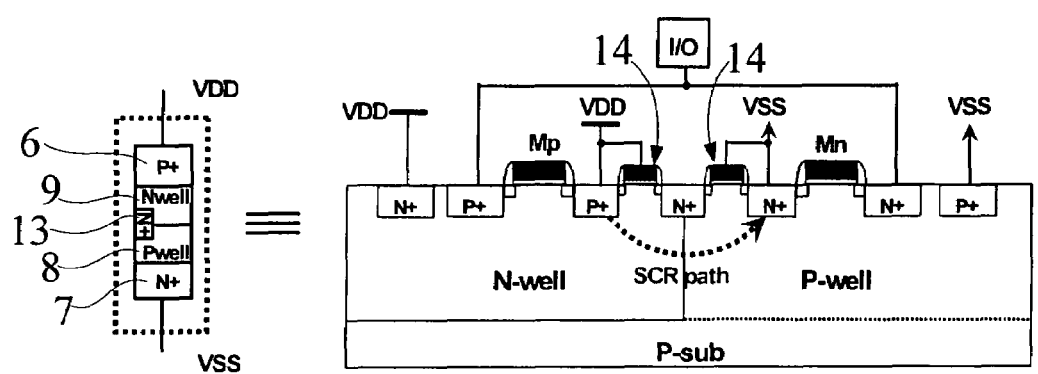
FIG. 9 is a view showing an eighth embodiment according to the present invention.
Figure 10:
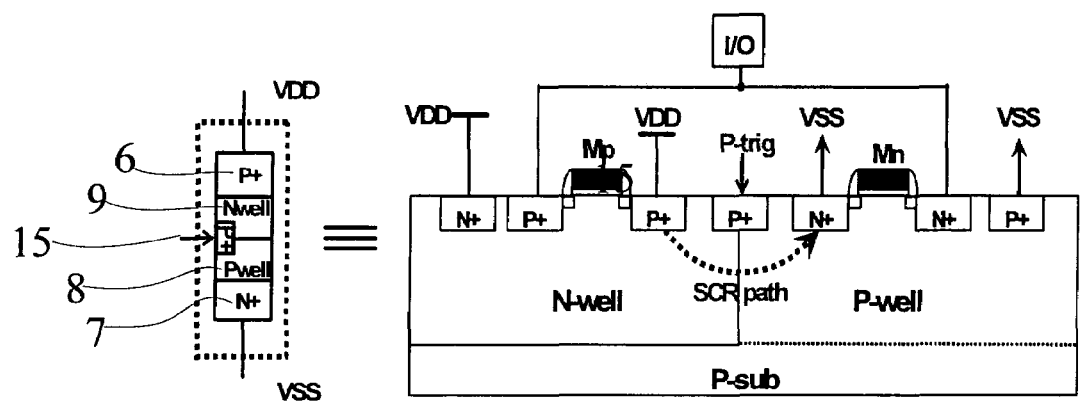
FIG. 10 is a view showing a ninth embodiment according to the present invention.
Figure 11:
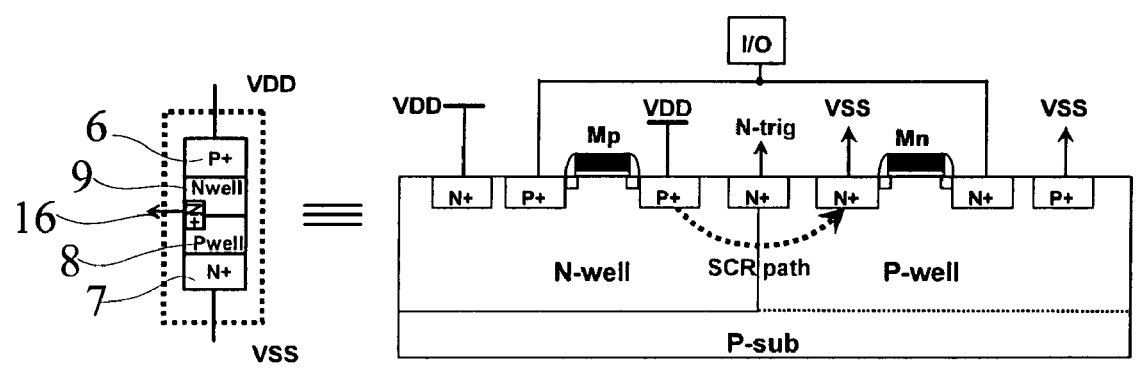
FIG. 11 is a view showing a tenth embodiment according to the present invention.
Figure 12:
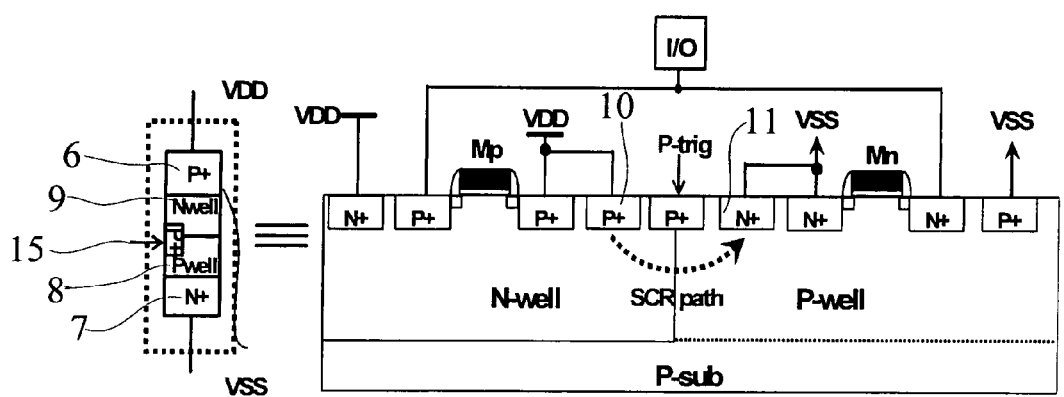
FIG. 12 is a view showing an eleventh embodiment according to the present invention.
Figure 13:
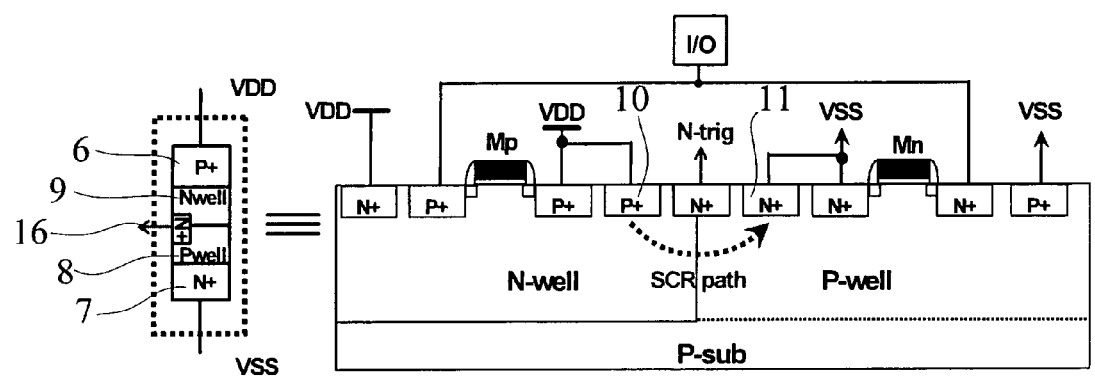
FIG. 13 is a view showing a twelfth embodiment according to the present invention.
Figure 14:
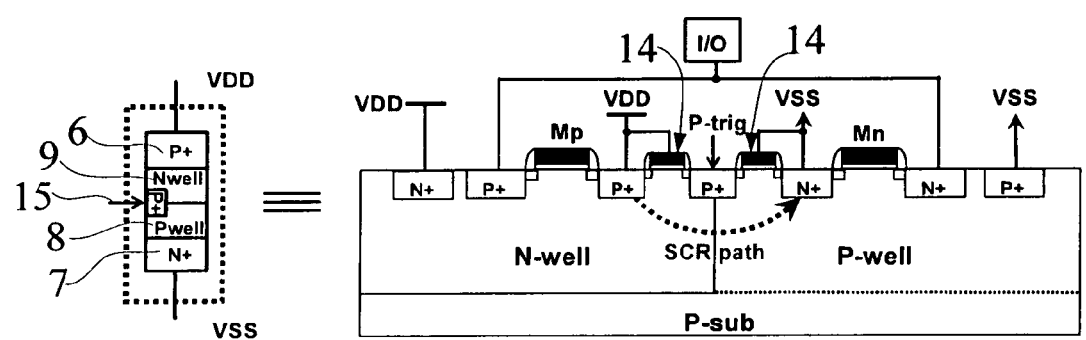
FIG. 14 is a view showing a thirteenth embodiment according to the present invention.
Figure 15:
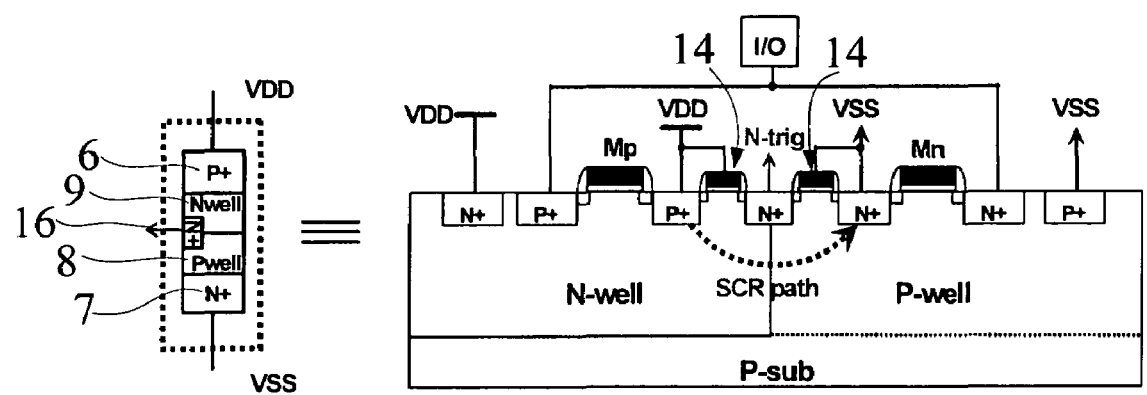
FIG. 15 is a view showing a fourteenth embodiment according to the present invention.
Figure 16:
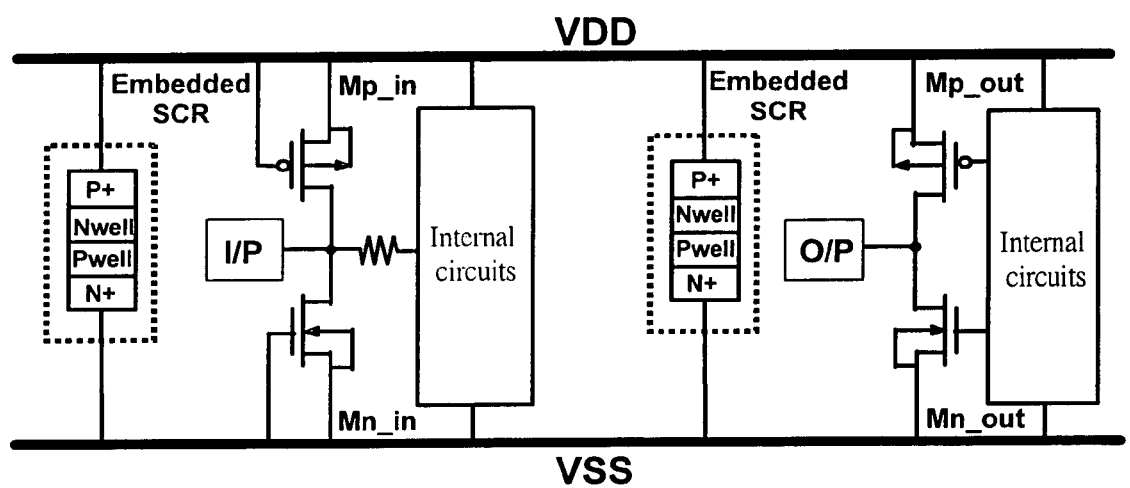
FIG. 16 is a view showing a first embodiment of circuit according to the present invention.

Please refer to FIG. 2 through FIG. 15. FIG. 2 is a view showing a first embodiment according to the present invention. FIG. 3 is a view showing a second embodiment according to the present invention. FIG. 4 is a view showing a third embodiment according to the present invention. FIG. 5 is a view showing a fourth embodiment according to the present invention. FIG. 6 is a view showing a fifth embodiment according to the present invention. FIG. 7 is a view showing a sixth embodiment according to the present invention. FIG. 8 is a view showing a seventh embodiment according to the present invention. FIG. 9 is a view showing an eighth embodiment according to the present invention. FIG. 10 is a view showing a ninth embodiment according to the present invention. FIG. 11 is a view showing a tenth embodiment according to the present invention. FIG. 12 is a view showing an eleventh embodiment according to the present invention. FIG. 13 is a view showing a twelfth embodiment according to the present invention. FIG. 14 is a view showing a thirteenth embodiment according to the present invention. FIG. 15 is a view showing a fourteenth embodiment according to the present invention. Therein, the SCR structure of the present invention is formed respectively as illustrated in FIG. 2 through FIG. 15, while the differences among the SCR structures are described respectively as below:

Please refer to FIG. 2. The SCR structure 5 of the present invention is comprised of a first P-typed high-doped region ($P^+$) 6, a first N-typed high-doped region ($N^+$) 7, a P-well 8 and an N-well 9. Additionally, the SCR structure 5 can be collocated with FIG. 16 to protect internal circuit, wherein FIG. 16 is a view showing a first embodiment of circuit according to the present invention.

Please refer to FIG. 3. The SCR structure 5 of the present invention is comprised of a first P-typed high-doped region ($P^+$) 6, a first N-typed high-doped region ($N^+$) 7, a P-well 8 and an N-well 9, and is further comprised of a second P-typed high-doped region (P$^+$) 10 as an anode and a second N-typed high-doped region (N$^+$) 11 as a cathode. Additionally, the SCR structure 5 can be collocated with FIG. 16 to protect internal circuit, wherein FIG. 16 is a view showing a first embodiment of circuit according to the present invention.

Figure 17:
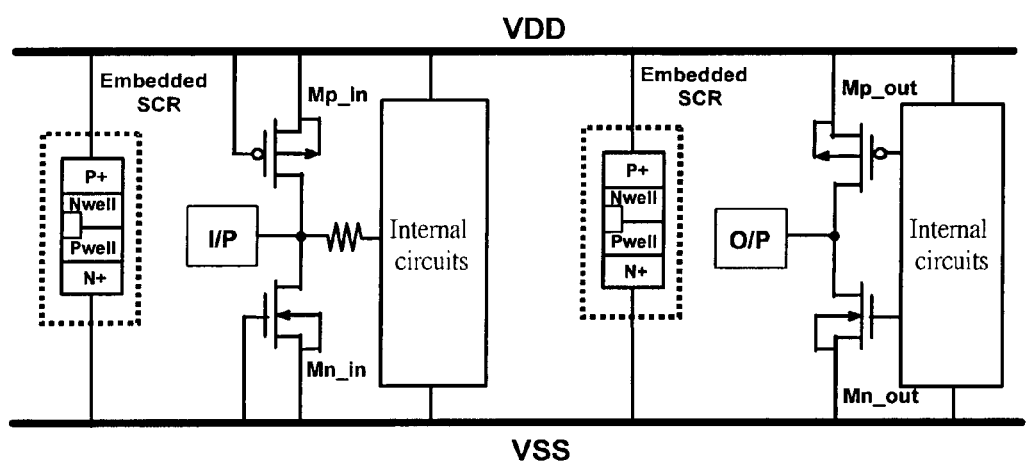
FIG. 17 is a view showing a second embodiment of circuit according to the present invention.

Please refer to FIG. 4. The SCR structure 5 of the present invention is comprised of a first P-typed high-doped region (P$^+$) 6, a first N-typed high-doped region (N$^+$) 7, a P-well 8, an N-well 9 and a third P-typed high-doped region (P$^+$) 12. Additionally, the SCR structure 5 can be collocated with FIG. 17 to protect internal circuit, wherein FIG. 17 is a view showing a second embodiment of circuit according to the present invention.

Figure 18:
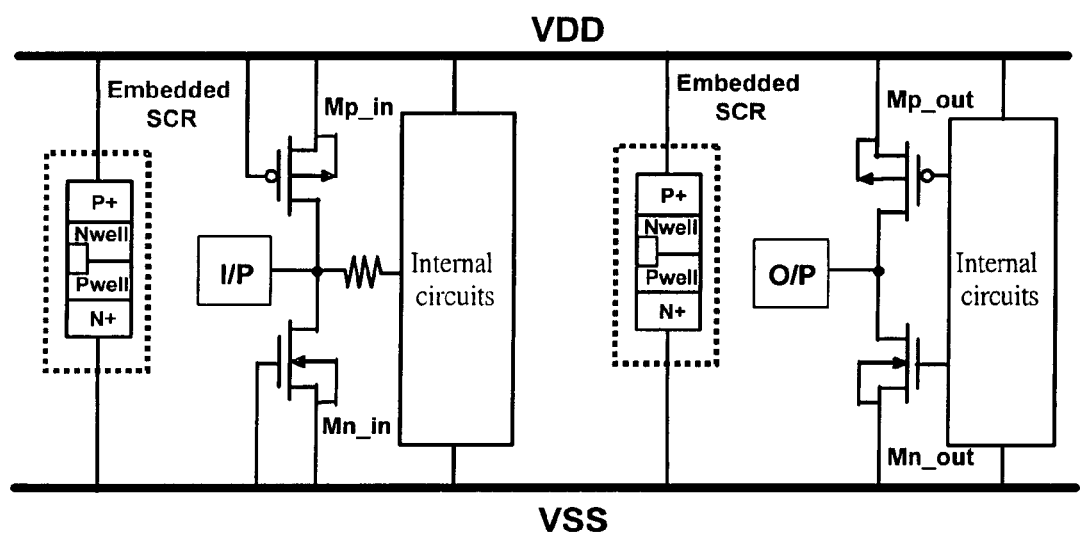
FIG. 18 is a view showing a third embodiment of circuit according to the present invention.

Please refer to FIG. 5. The SCR structure 5 of the present invention is comprised of a first P-typed high-doped region (P$^+$) 6, a first N-typed high-doped region (N$^+$) 7, a P-well 8, an N-well 9 and a third N-typed high-doped region (N$^+$) 13. Additionally, the SCR structure 5 can be collocated with FIG. 18 to protect internal circuit, wherein FIG. 18 is a view showing a third embodiment of circuit according to the present invention.

Please refer to FIG. 6, the SCR structure 5 of the present invention is comprised of a first P-typed high-doped region (P$^+$) 6, a first N-typed high-doped region (N$^+$) 7, a P-well 8, an N-well 9, a second P-typed high-doped region (P$^+$) 10 as an anode, a second N-typed high-doped region (N$^+$) 11 as a cathode and a third P-typed high-doped region(P$^+$) 12. Additionally, the SCR structure 5 can be collocated with FIG. 17 to protect internal circuit, wherein FIG. 17 is a view showing a second embodiment of circuit according to the present invention.

Please refer to FIG. 7, the SCR structure 5 of the present invention is comprised of a first P-typed high-doped region (P$^+$) 6, a first N-typed high-doped region (N$^+$) 7, a P-well 8, an N-well 9, a second P-typed high-doped region (P$^+$) 10 as an anode, a second N-typed high-doped region (N$^+$) 11 as a cathode and a third N-typed high-doped region (N$^+$) 13. Additionally, the SCR structure 5 can be collocated with FIG. 18 to protect internal circuit, wherein FIG. 18 is a view showing a third embodiment of circuit according to the present invention.

Please refer to FIG. 8, the SCR structure 5 of the present invention is comprised of a first P-typed high-doped region (P$^+$) 6, a first N-typed high-doped region (N$^+$) 7, a P-well 8, an N-well 9, at least one dummy gate 14 and a third P-typed high-doped region (P$^+$) 12. Additionally, the SCR structure 5 can be collocated with FIG. 17 to protect internal circuit, wherein FIG. 17 is a view showing a second embodiment of circuit according to the present invention.

Please refer to FIG. 9, the SCR structure 5 of the present invention is comprised of a first P-typed high-doped region (P$^+$) 6, a first N-typed high-doped region (N$^+$) 7, a P-well 8, an N-well 9, at least one dummy gate 14 and a third N-typed high-doped region (N$^+$) 13. Additionally, the SCR structure 5 can be collocated with FIG. 18 to protect internal circuit, wherein FIG. 18 is a view showing a third embodiment of circuit according to the present invention.

Figure 19:
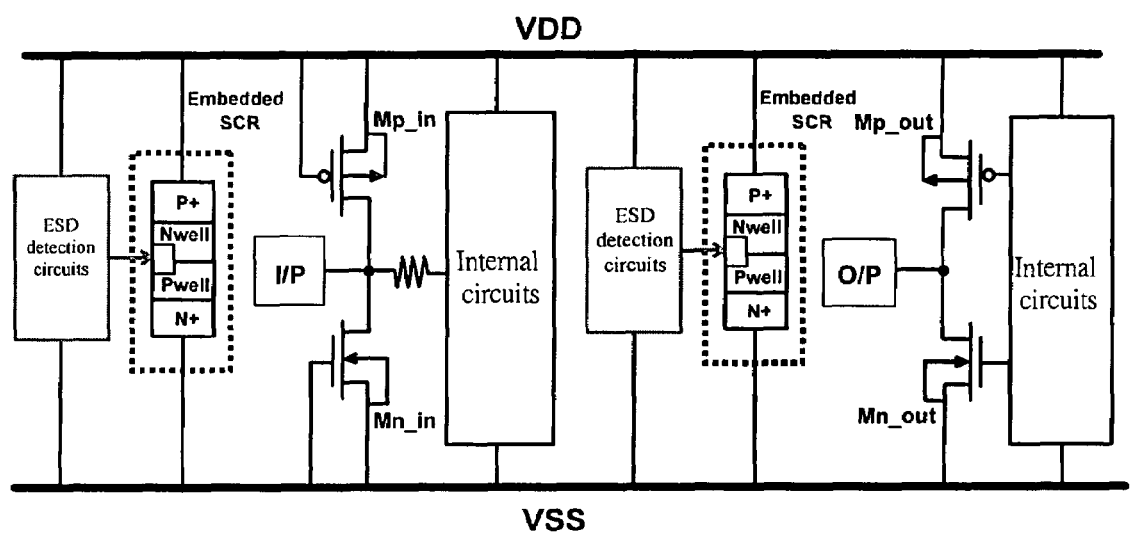
FIG. 19 is a view showing a fourth embodiment of circuit according to the present invention.
Figure 21:
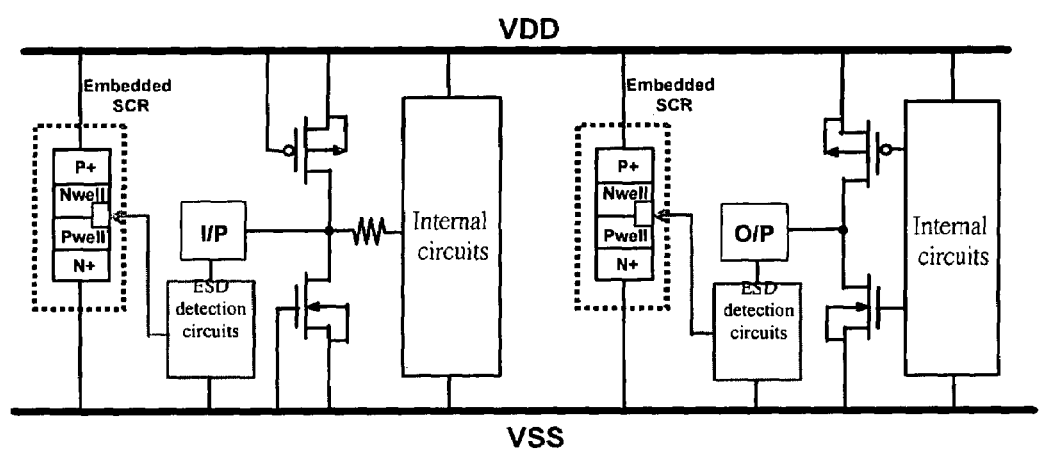
FIG. 21 is a view showing a sixth embodiment of circuit according to the present invention.
Figure 23:
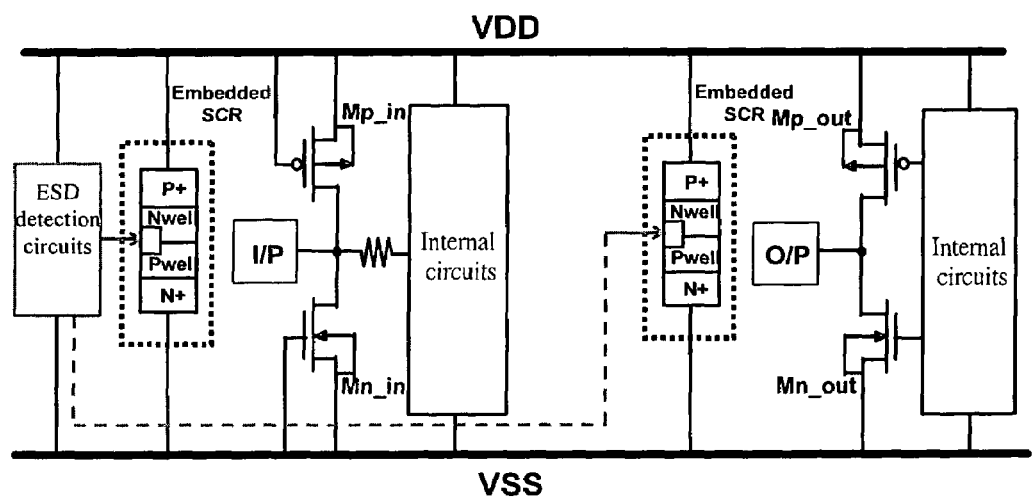
FIG. 23 is a view showing an eighth embodiment of circuit according to the present invention.

Please refer to FIG. 10, the SCR structure 5 of the present invention is comprised of a first P-typed high-doped region (P$^+$) 6, a first N-typed high-doped region (N$^+$) 7, a P-well 8, an N-well 9 and a fourth P-typed high-doped region (P$^+$) 15 as a trigger node. Additionally, the SCR structure 5 can be collocated with FIG. 19, FIG. 21 and FIG. 23 to protect internal circuit, wherein FIG. 19, FIG. 21 and FIG. 23 are views showing a fourth, a sixth and an eighth embodiments of circuit according to the present invention.

Figure 20:
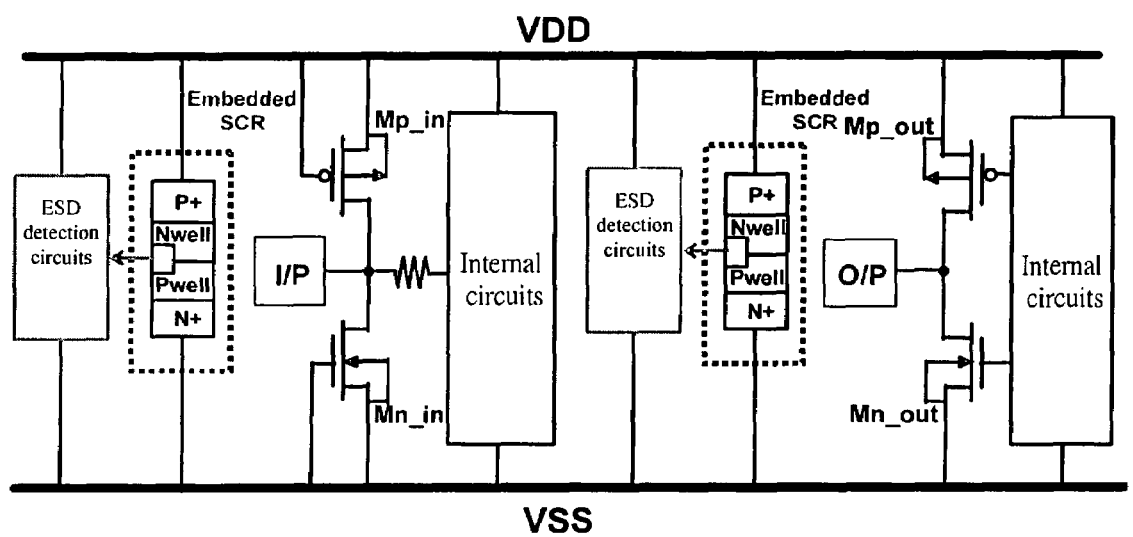
FIG. 20 is a view showing a fifth embodiment of circuit according to the present invention.
Figure 22:
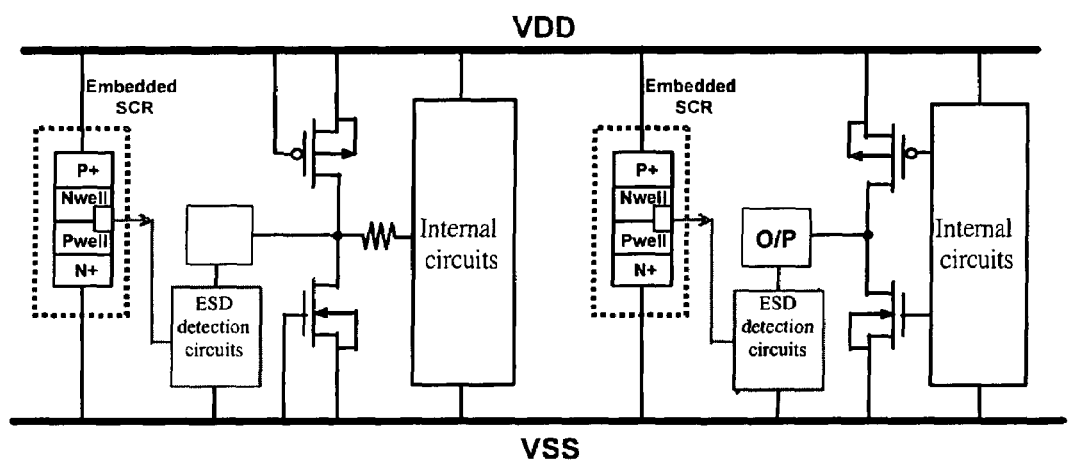
FIG. 22 is a view showing a seventh embodiment of circuit according to the present invention.
Figure 24:
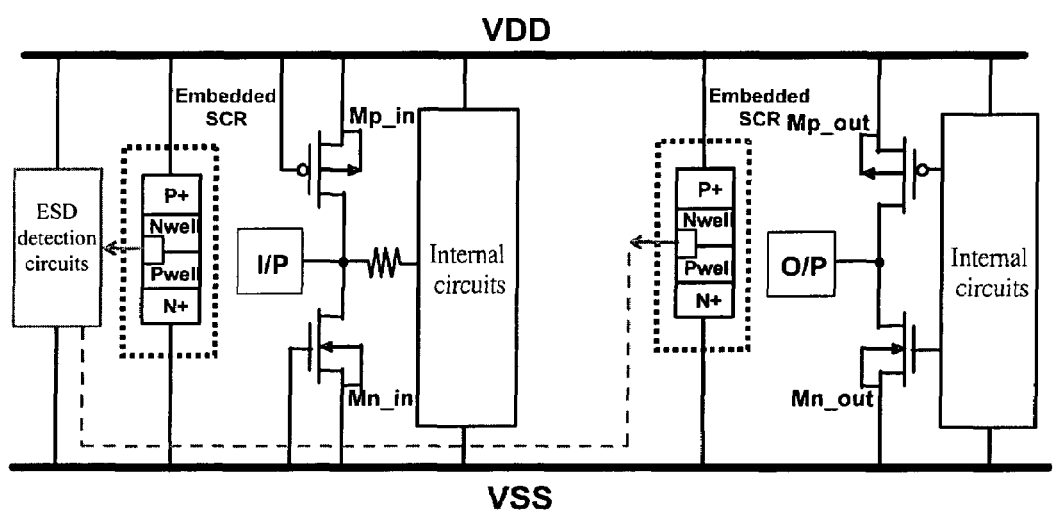
FIG. 24 is a view showing a ninth embodiment of circuit according to the present invention.

Please refer to FIG. 11, the SCR structure 5 of the present invention is comprised of a first P-typed high-doped region (P$^+$) 6, a first N-typed high-doped region (N$^+$) 7, a P-well 8, an N-well 9 and a fourth N-typed high-doped region (N$^+$) 16 as a trigger node. Additionally, the SCR structure 5 can be collocated with FIG. 20, FIG. 22 and FIG. 24 to protect internal circuit, wherein FIG. 20, FIG. 22 and FIG. 24 are views showing a fifth, a seventh and a ninth embodiments of circuit according to the present invention.

Please refer to FIG. 12, the SCR structure 5 of the present invention is comprised of a first P-typed high-doped region (P$^+$) 6, a first N-typed high-doped region (N$^+$) 7, a P-well 8, an N-well 9, a second P-typed high-doped region (P$^+$) 10 as an anode, a second N-typed high-doped region (N$^+$) 11 as a cathode and a fourth P-typed high-doped region (P$^+$) 15 as a trigger node. Additionally, the SCR structure 5 can be collocated with FIG. 19, FIG. 21 and FIG. 23 to protect internal circuit, wherein FIG. 19, FIG. 21 and FIG. 23 are views showing a fourth, a sixth and an eighth embodiments of circuit according to the present invention.

Please refer to FIG. 13, the SCR structure 5 of the present invention is comprised of a first P-typed high-doped region (P$^+$) 6, a first N-typed high-doped region (N$^+$) 7, a P-well 8, an N-well 9, a second P-typed high-doped region (P$^+$) 10 as an anode, a second N-typed high-doped region (N$^+$) 11 as a cathode and a fourth N-typed high-doped region (N$^+$) 16 as a trigger node. Additionally, the SCR structure 5 can be collocated with FIG. 20, FIG. 22 and FIG. 24 to protect internal circuit, wherein FIG. 20, FIG. 22 and FIG. 24 are views showing a fifth, a seventh and a ninth embodiments of circuit according to the present invention.

Please refer to FIG. 14, the SCR structure 5 of the present invention is comprised of a first P-typed high-doped region (P$^+$) 6, a first N-typed high-doped region (N$^+$) 7, a P-well 8, an N-well 9, at least one dummy gate 14 and a fourth P-typed high-doped region (P$^+$) 15 as a trigger node. Additionally, the SCR structure 5 can be collocated with FIG. 19, FIG. 21 and FIG. 23 to protect internal circuit, wherein FIG. 19, FIG. 21 and FIG. 23 are views showing a fourth, a sixth and an eighth embodiments of circuit according to the present invention.

Please refer to FIG. 15, the SCR structure 5 of the present invention is comprised of a first P-typed high-doped region (P$^+$) 6, a first N-typed high-doped region (N$^+$) 7, a P-well 8, an N-well 9, at least one dummy gate 14 and a fourth N-typed high-doped region (N$^+$) 16 as a trigger node. Additionally, the SCR structure 5 can be collocated with FIG. 20, FIG. 22 and FIG. 24 to protect internal circuit, wherein FIG. 20, FIG. 22 and FIG. 24 are views showing a fifth, a seventh and a ninth embodiments of circuit according to the present invention.

In addition, please refer to FIG. 16 through FIG. 24. Therein, FIG. 16 is a view showing a first embodiment of circuit according to the present invention. FIG. 17 is a view showing a second embodiment of circuit according to the present invention. FIG. 18 is a view showing a third embodiment of circuit according to the present invention. FIG. 19 is a view showing a fourth embodiment of circuit according to the present invention. FIG. 20 is a view showing a fifth embodiment of circuit according to the present invention. FIG. 21 is a view showing a sixth embodiment of circuit according to the present invention. FIG. 22 is a view showing a seventh embodiment of circuit according to the present invention. FIG. 23 is a view showing an eighth embodiment of circuit according to the present invention. FIG. 24 is a view showing a ninth embodiment of circuit according to the present invention.

Figure 25:
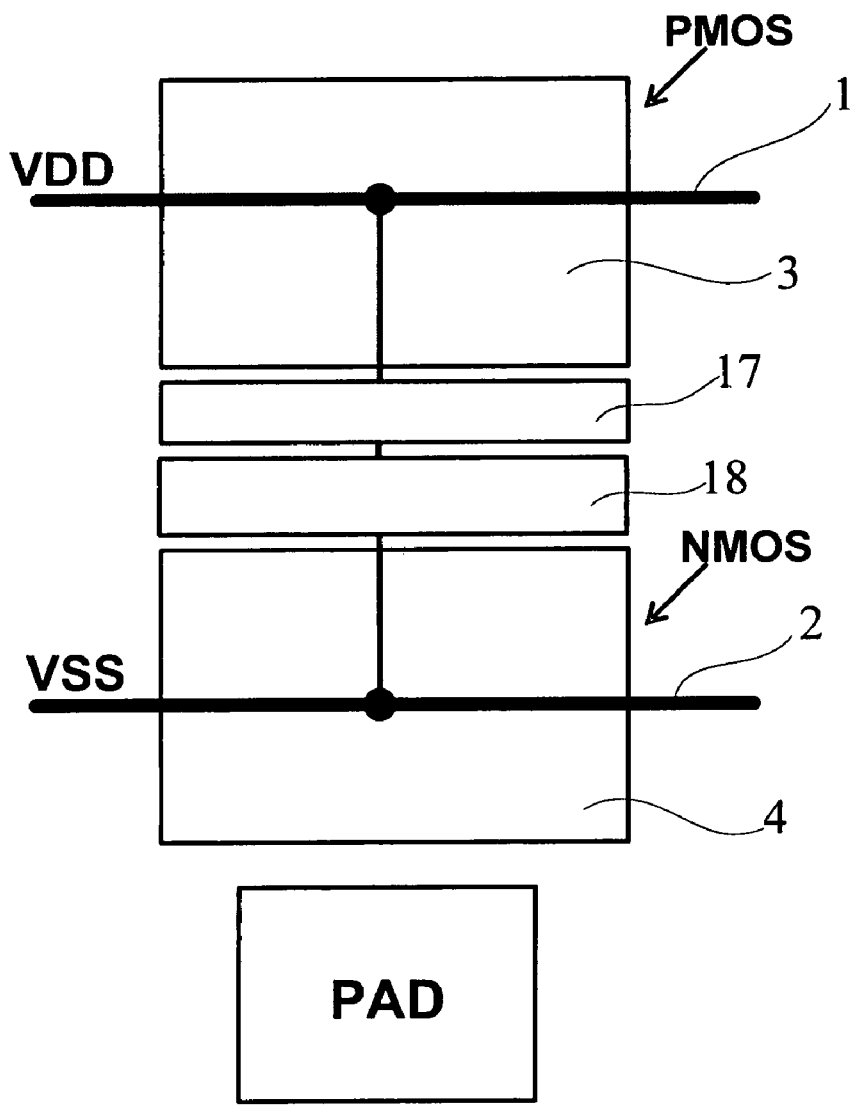
FIG. 25 is a view showing the structure of another embodiment according to the present invention.
Figure 26:
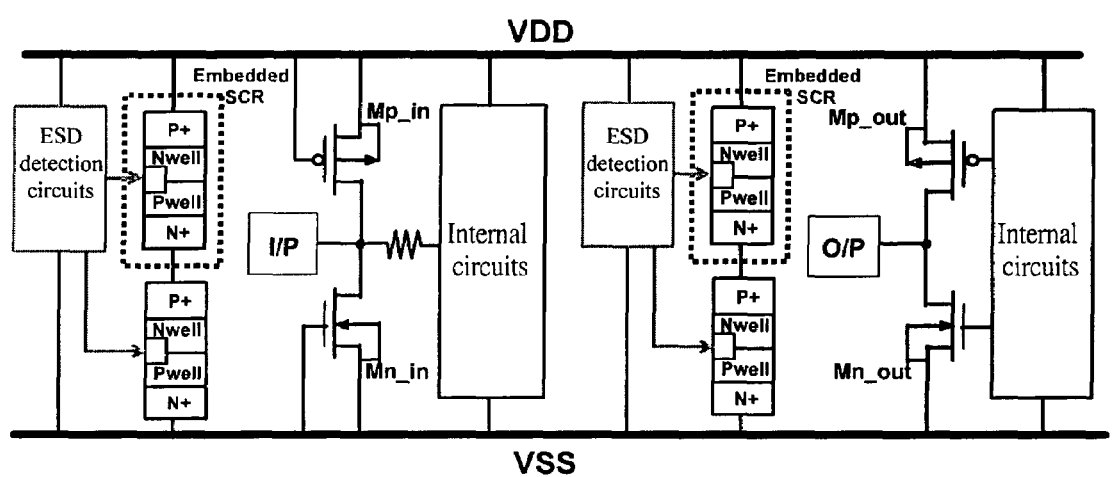
FIG. 26 is a view showing a tenth embodiment of circuit according to the present invention.
Figure 27:
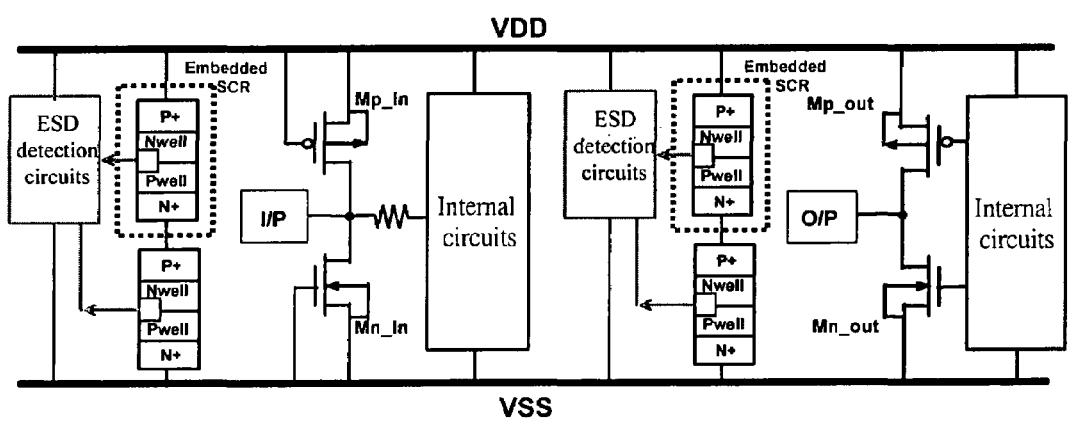
FIG. 27 is a view showing an eleventh embodiment of circuit according to the present invention.
Figure 28:
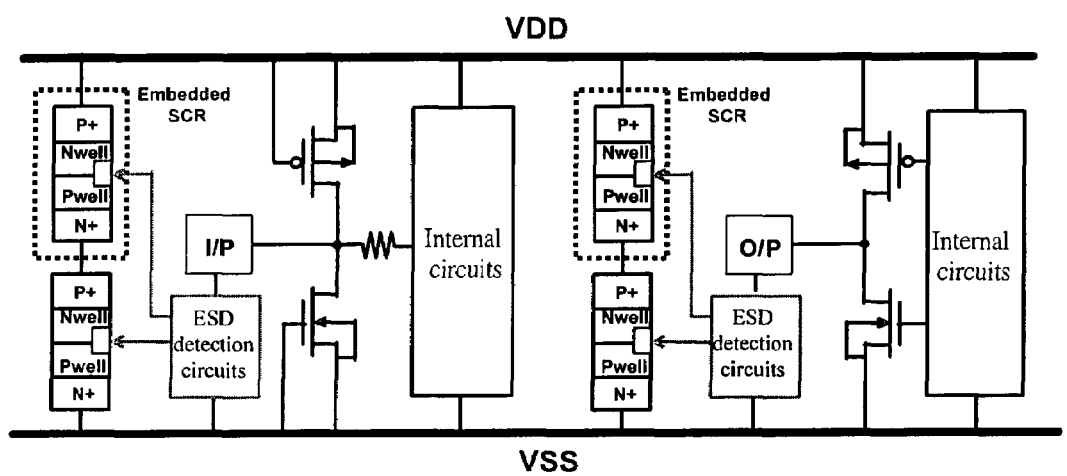
FIG. 28 is a view showing a twelfth embodiment of circuit according to the present invention.
Figure 29:
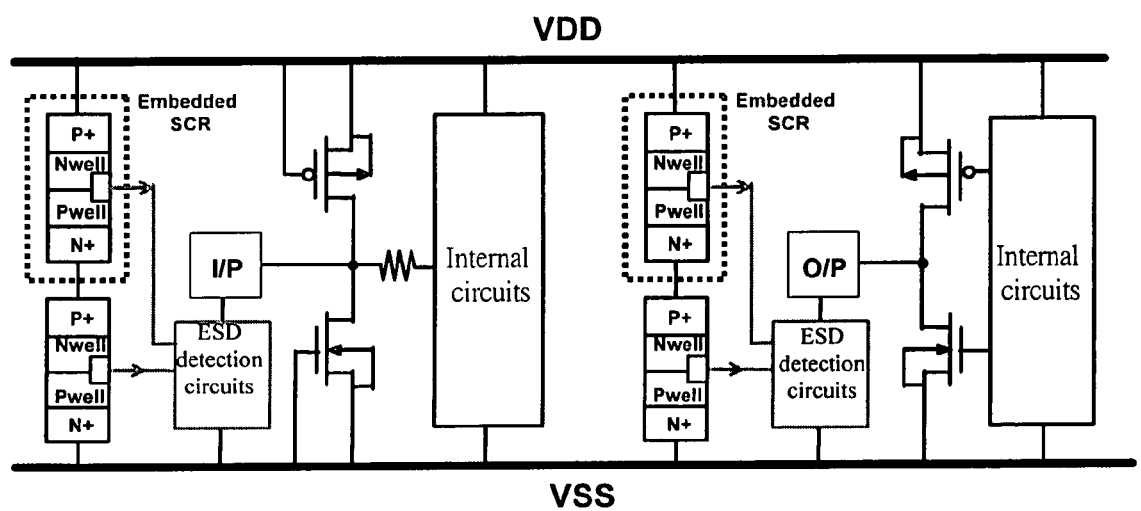
FIG. 29 is a view showing a thirteenth embodiment of circuit according to the present invention.
Figure 30:
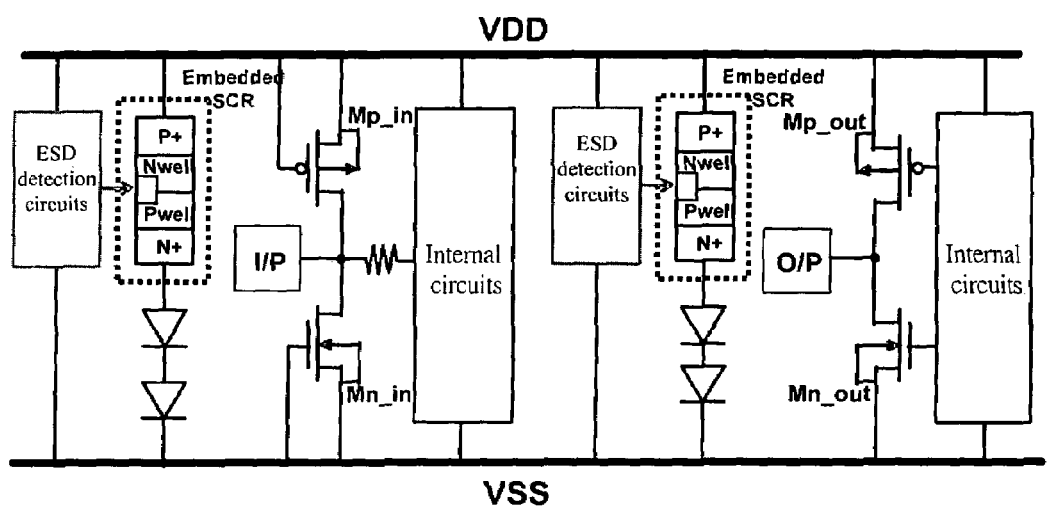
FIG. 30 is a view showing a fourteenth embodiment of circuit according to the present invention.
Figure 31:
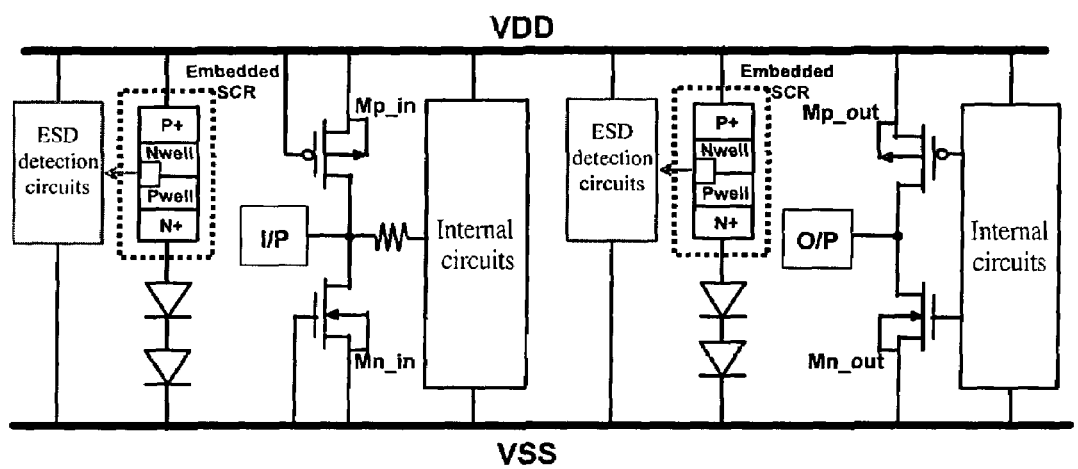
FIG. 31 is a view showing a fifteenth embodiment of circuit according to the present invention.
Figure 32:
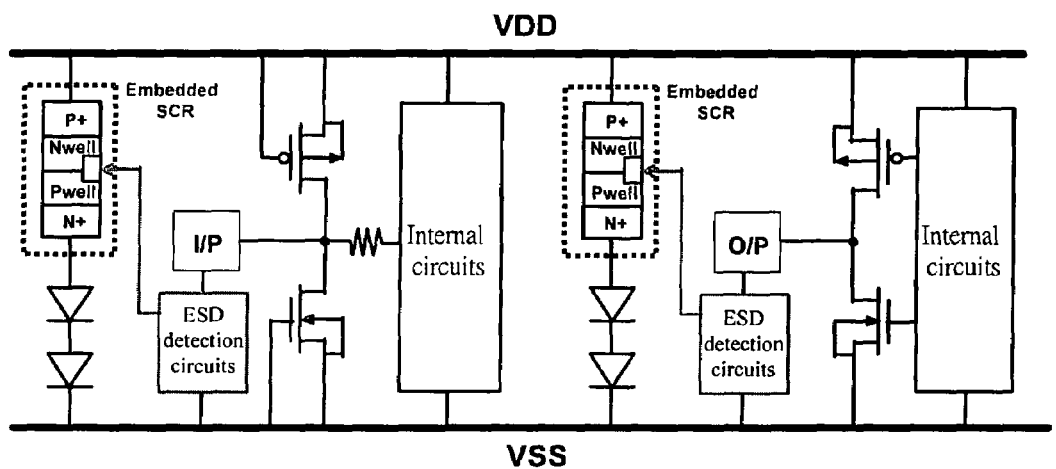
FIG. 32 is a view showing a sixteenth embodiment of circuit according to the present invention.
Figure 33:
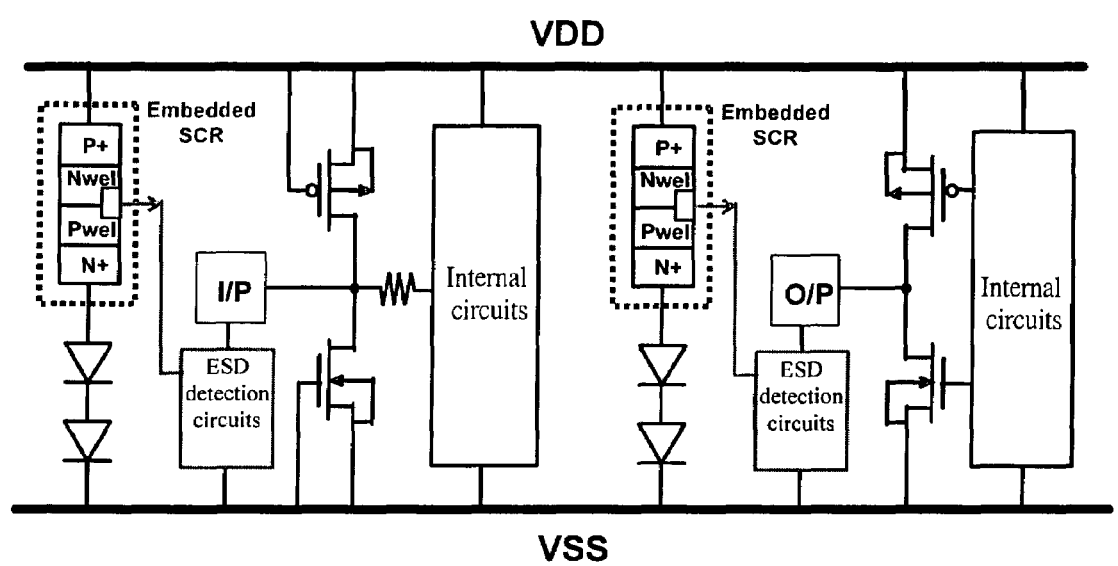
FIG. 33 is a view showing a seventeenth embodiment of circuit according to the present invention.
Figure 34:
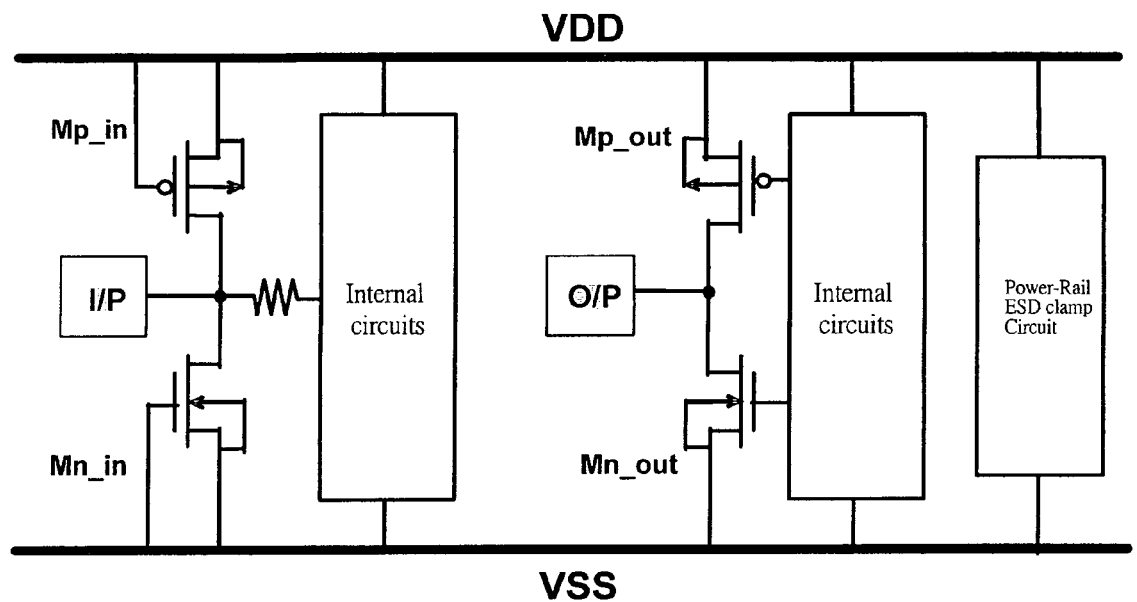
FIG. 34 is a view showing an ESD protection design for CMOS integrated circuit (IC) of a conventional art.
Figure 35:
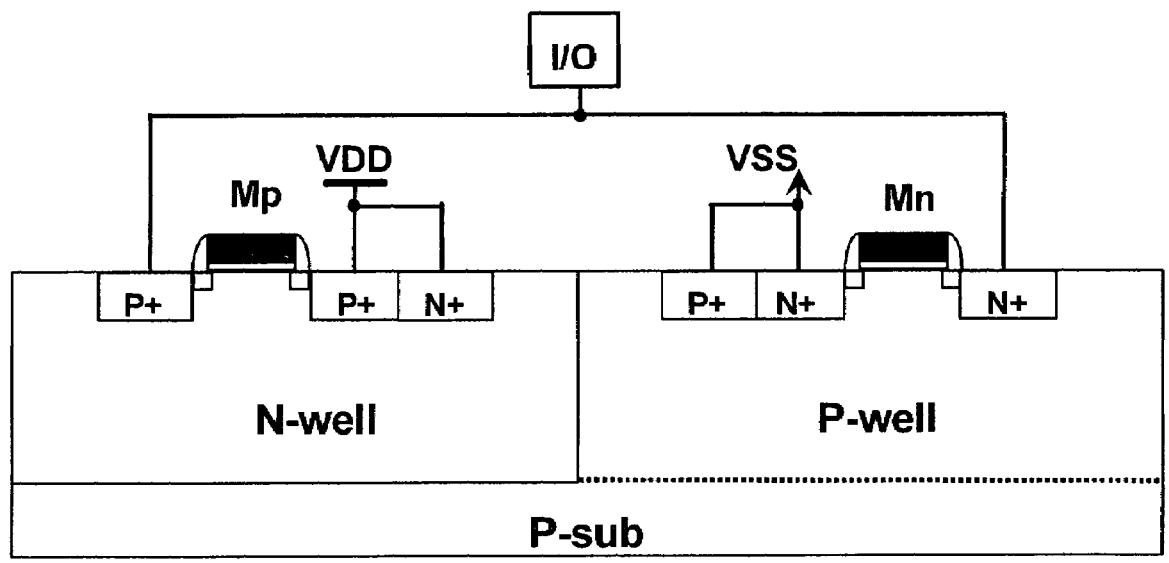
FIG. 35($a$) is a view showing an ESD protection device having a single guard ring structure inserted between the PMOS and NMOS of I/O buffers of a conventional art.
Figure 35:
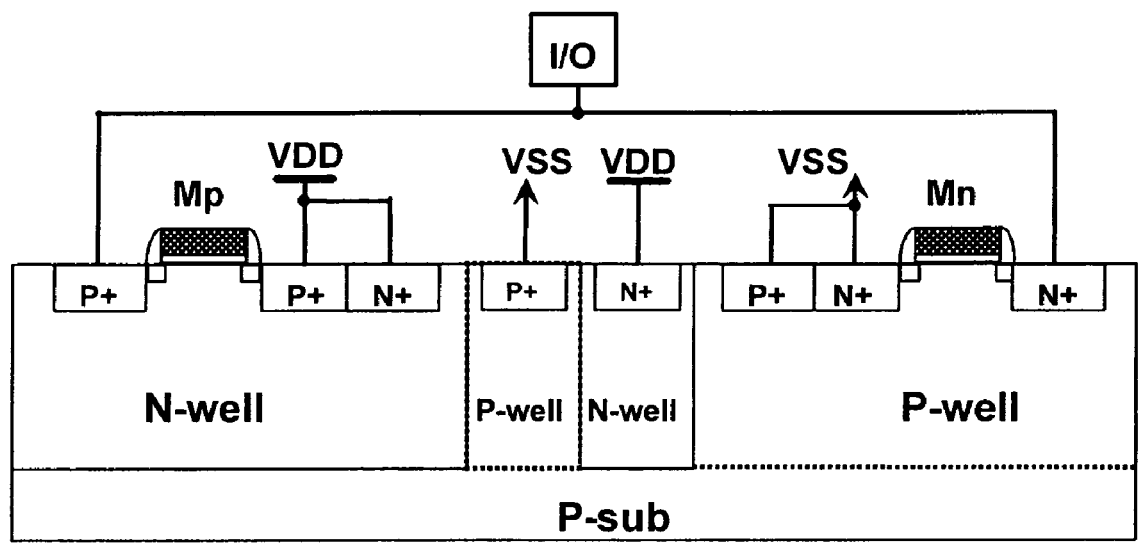

Please refer to FIG. 25. FIG. 25 is a view showing the structure of another embodiment according to the present invention. The another embodiment is comprised of two terminal electrodes of a first electrode 1 having high-potential power supply voltage such as VDD and a second electrode 2 having low-potential power supply voltage such as VSS, a PMOS 3, an NMOS 4, an SCR structure 17 and another protection structure 18. Therein, the SCR structure 17 is connected from first electrode 1 to another protection structure 18, while another protection structure is connected from the SCR structure 17 to second electrode 2. The PMOS 3 is connected to the first electrode 1 and the NMOS 4 is connected to the second electrode 2, while SCR structure 17 and another protection structure 18 are placed between PMOS 3 and NMOS 4, to form a circuit protection. Furthermore, the protection structure 18 at least comprises a diode structure or an SCR structure. Additionally, with references to FIG. 26 to FIG. 33, they are views showing embodiments of the circuit for related applications according to the present invention. FIG. 26 is a view showing a tenth embodiment of circuit according to the present invention. FIG. 27 is a view showing an eleventh embodiment of circuit according to the present invention. FIG. 28 is a view showing a twelfth embodiment of circuit according to the present invention. FIG. 29 is a view showing a thirteenth embodiment of circuit according to the present invention. FIG. 30 is a view showing a fourteenth embodiment of circuit according to the present invention. FIG. 31 is a view showing a fifteenth embodiment of circuit according to the present invention. FIG. 32 is a view showing a sixteenth embodiment of circuit according to the present invention. FIG. 33 is a view showing a seventeenth embodiment of circuit according to the present invention.

In addition, in the structures of another embodiment of the present invention, the SCR structure 17 and the protection structure 18 are comprised of the structures which are shown in FIG. 10 through FIG. 15 respectively and are comprised of circuits which are shown in FIG. 26 through FIG. 29. Furthermore, the protection structure 18 can be comprised of diode which is shown in FIG. 30 through FIG. 33.

According to the above structures, the present invention relates to an SCR for the ESD protection. More particularly, the present invention relates to a device which utilizes embedded SCR in order to provide ESD protection. As a result, a whole-chip ESD protection design can be achieved by each individual I/O cell in CMOS (Complementary Metal Oxide Semiconductor) IC (Integrated Circuit) with no extra power-rail ESD clamp circuit needed.

The path of the embedded SCR for the ESD protection is formed between a first electrode 1 having high-potential power supply voltage such as VDD and a second electrode 2 having low-potential power supply voltage such as VSS. The turn-on speed of the embedded SCR can be improved by adding triggers in SCR path.

When ESD happens, the embedded SCR is quickly triggered on by ESD detection circuit. By the design according to the present invention, the ESD robustness of the whole chip can be efficiently improved with a much smaller layout area. Moreover, the present invention is suitable for applications of IC design and foundry industry. In addition, the present invention is also suitable for effective ESD protection in sub micrometer CMOS IC products.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. An SCR (Silicon Controlled Rectifier) for ESD (Electrostatic Discharge) protection comprising:
    two terminal electrodes of a first electrode and a second electrode;
    a PMOS device configured to provide ESD protection between a PAD line and a VDD line;
    an NMOS device configured to provide ESD protection between the PAD line and a VSS line; and
    an SCR structure comprising a power-rail ESD clamp device connected between the VDD line and the VSS line, the SCR further comprising a first P-typed high-doped region (P+) electrically connected to a second P-typed high-doped region (P+), and a first N-typed high-doped region (N+) electrically connected to a second N-typed high-doped region (N+),
    wherein the second P-typed high-doped region (P+) is an anode and the second N-typed high-doped region (N+) is a cathode,
    wherein said PMOS device is connected to said first electrode and said NMOS device is connected to second electrode, while said SCR structure is placed between said PMOS device and said NMOS device, said SCR structure being embedded in said PMOS device and said NMOS device, to form a circuit protection,
    wherein the combination of the PMOS device, the NMOS device, and the SCR structure forms a single I/O cell.

2. The SCR for the ESD protection according to claim 1, wherein said SCR structure further comprises a P-well and an N-well.

3. The SCR for the ESD protection according to claim 1, wherein said SCR structure further comprises a P-well, an N-well, and a third P-typed high-doped region (P+).

4. The SCR for the ESD protection according to claim 1, wherein said SCR structure further comprises a P-well, an N-well, and a third N-typed high-doped region (N+).

5. The SCR for the ESD protection according to claim 1, wherein said SCR structure further comprises a P-well, an N-well, and a fourth P-typed high-doped region (P+) as a trigger.

6. The SCR for the ESD protection according to claim 1, wherein said SCR structure further comprises a P-well, an N-well, and a fourth N-typed high-doped region (N+) as a trigger.

7. The SCR for the ESD protection according to claim 1, wherein an ESD performance of the I/O cell is independent from a spacing distance between an I/O and the power-rail ESD clamp device.

8. An SCR (Silicon Controlled Rectifier) for ESD (Electrostatic Discharge) protection comprising:
    a first electrode and a second electrode as two terminal electrodes;
    a PMOS device configured to provide ESD protection between a PAD line and a VDD line;
    an NMOS device configured to provide ESD protection between the PAD line and a VSS line;
    an SCR structure and another protection structure comprising a power-rail ESD clamp device connected between the VDD line and the VSS line, the SCR further comprising a first P-typed high-doped region electrically connected to a second P-typed high-doped region, a first N-typed high-doped region, and a second N-typed high-doped region,
    wherein the second P-typed high-doped region (P+) is an anode and the second N-typed high-doped region (N+) is a cathode, wherein said SCR structure is connected from said first electrode to said another protection structure, while said another protection structure is connected from said SCR structure to said second electrode, said PMOS device is connected to said first electrode and said NMOS device is connected to said second electrode, while said SCR structure and said another protection structure are placed between said PMOS device and said NMOS device, said SCR structure being embedded in said PMOS device and said NMOS device, to form a circuit protection, wherein the combination of the PMOS device, the NMOS device, the SCR structure, and the another protection structure forms a single I/O cell.

9. The SCR for the ESD protection according to claim 8, wherein said another protection structure at least comprises a diode structure or an SCR structure.

10. The SCR for the ESD protection according to claim 8, wherein said SCR structure further comprises a P-well and an N-well.

11. The SCR for the ESD protection according to claim 8, wherein said SCR structure further comprises a P-well, an N-well, and a third P-typed high-doped region (P+).

12. The SCR for the ESD protection according to claim 8, wherein said SCR structure further comprises a P-well, an N-well, and a third N-typed high-doped region (N+).

13. The SCR for the ESD protection according to claim 8, wherein said SCR structure further comprises a P-well, an N-well, and a fourth P-typed high-doped region (P+) as a trigger.

14. The SCR for the ESD protection according to claim 8, wherein said SCR structure further comprises a P-well, an N-well, and a fourth N-typed high-doped region (N+) as a trigger.

15. The SCR for the ESD protection according to claim 8, wherein an ESD performance of the I/O cell is independent from a spacing distance between an I/O and the power-rail ESD clamp device.

* * * * *